United States Patent
Sasada et al.

(10) Patent No.: US 6,342,440 B1
(45) Date of Patent: Jan. 29, 2002

(54) METHOD FOR FORMING LOW-LEAKAGE IMPURITY REGIONS BY SEQUENCE OF HIGH-AND LOW-TEMPERATURE TREATMENTS

(75) Inventors: Kazuhiro Sasada, Hashima; Yasunori Inoue, Ohgaki; Shinichi Tanimoto, Bisai; Atsuhiro Nishida, Ohgaki; Yoshikazu Ibara, Gifu, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/518,246

(22) Filed: Mar. 3, 2000

(30) Foreign Application Priority Data

Mar. 5, 1999 (JP) .......................................... 11-058737
Feb. 1, 2000 (JP) .......................................... 12-024448

(51) Int. Cl.[7] ........................................... H01L 21/425
(52) U.S. Cl. ........................................................ 438/530
(58) Field of Search ................................ 438/530, 795, 438/511, 514

(56) References Cited

U.S. PATENT DOCUMENTS 5,940,699 A * 8/1999 Sumi et al.

FOREIGN PATENT DOCUMENTS

JP 10-41407 2/1998

OTHER PUBLICATIONS

Yoshida et. al., "Thermally Stable, Low–Leakage Self–Aligned Titanium Silicide Junctions", J. Electrochem. Soc., vol. 137, No. 6, Jun. 1990; pp. 1914 to 1917.

* cited by examiner

Primary Examiner—Charles Bowers
Assistant Examiner—Evan Pert
(74) Attorney, Agent, or Firm—Armstrong, Westerman, Hattori, McLeland & Naughton, LLP

(57) ABSTRACT

A method of manufacturing a semiconductor device capable of suppressing increase of a leakage current resulting from a high-temperature heat treatment is obtained. In this manufacturing method, an impurity region is formed by selectively ion-implanting an impurity into the main surface of a semiconductor substrate. The impurity region is activated by performing a high-temperature heat treatment. The semiconductor device is recovered from crystal defects resulting from the high-temperature heat treatment by performing a low-temperature heat treatment after performing the high-temperature heat treatment. According to this manufacturing method, the semiconductor device is recovered from the crystal defects resulting from the ion implantation by the high-temperature heat treatment, and recovered from the crystal defects resulting from the high-temperature heat treatment by the low-temperature heat treatment. Thus, increase of a leakage current caused by the crystal defects resulting from the high-temperature heat treatment can be effectively prevented.

12 Claims, 5 Drawing Sheets

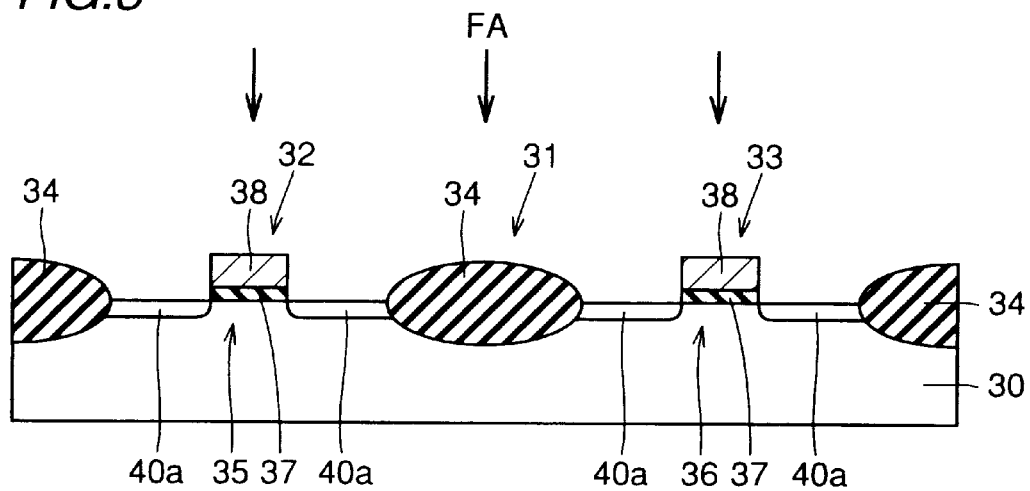
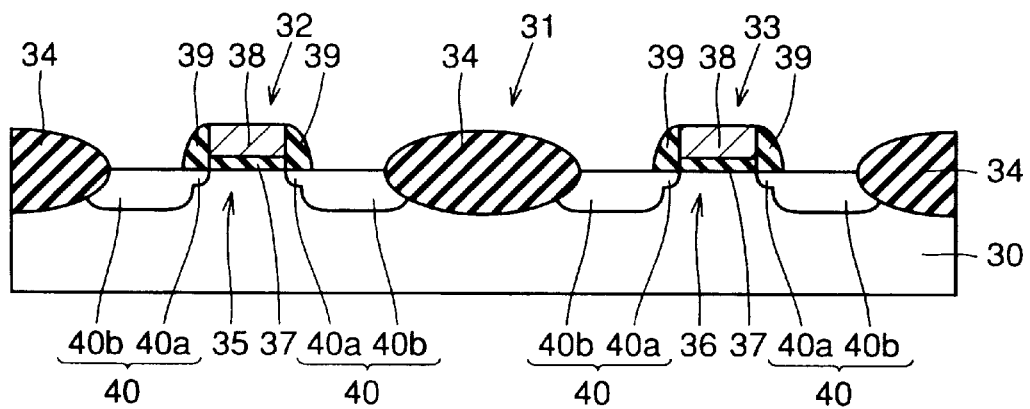

METHOD FOR FORMING LOW-LEAKAGE IMPURITY REGIONS BY SEQUENCE OF HIGH-AND LOW-TEMPERATURE TREATMENTS

BACKGROUND OF THE INVENTION

1. Field of the Invention

The present invention relates to a method of manufacturing a semiconductor device, and more specifically, it relates to a method of manufacturing a semiconductor device including a high-temperature heat treatment.

2. Description of the Prior Art

In order to increase the degree of integration and the speed of a semiconductor device, further reduction of the design rule is recently being studied. Prototypes of a 256M-DRAM (dynamic random access memory) and a CMOS (complementary metal oxide semiconductor) transistor having a gate length of 0.1 µm are announced nowadays. With such progress in refinement of the transistor, reduction of the device size along a scaling rule and following increase of the operating speed are expected.

When simply reducing the size of the transistor, channel resistance can be reduced. In this case, however parasitic resistance of an impurity diffusion layer for forming a source/drain region or resistance (contact resistance) in a contact part between conductors can become equivalent to or greater than the channel resistance, thus obstructing an increase of the operating speed. In order to increase the operating speed while implementing refinement of the transistor size, the resistance of a gate wire (electrode) must be reduced.

In general, a salicide (self-aligned silicide) method is proposed as a method of simultaneously reducing parasitic resistance of a source/drain region and wiring resistance of a gate electrode (T. Yoshida et al., J. Electrochemi. Soc., Vol. 137, No. 6 (1990), pp. 1914–1917). The salicide method is a technique of forming metal silicide films of low resistance on the gate electrode and the source/drain region in a self-aligned manner.

In a conventional p-channel MOS transistor having a salicide structure, titanium silicide films, for example, are formed on the surfaces of a source/drain region and a gate electrode, whereby parasitic resistance of the source/drain region and wiring resistance of the gate electrode can be simultaneously reduced.

When employing such a salicide technique, however, the bottom surface of the silicide film cuts into the surface of the source/drain region (impurity diffusion layer), and hence the junction surface of the source/drain region (impurity diffusion layer) must be increased in depth. When increasing the depth of the junction surface of the source/drain region, however, a source-to-drain leakage current (transverse leakage current) is disadvantageously increased. When reducing the depth of the junction surface of the source/drain region in order to avoid this problem, a leakage current (vertical leakage current) from the impurity diffusion layer to the substrate is disadvantageously increased due to crystal defects resulting from an ion implantation step for forming the source/drain region.

Japanese Patent Laying-Open No. 10-41407 (1998) proposes a technique of solving the problem of the crystal defects resulting from ion implantation. In a method of manufacturing a semiconductor device proposed in this gazette, ion implantation is selectively performed on a prescribed region of a semiconductor substrate, thereby forming an impurity region. A heat treatment (pre-annealing) is performed under a prescribed temperature for a constant time, thereby prompting recovery from crystal defects resulting from the aforementioned ion implantation in the impurity region. Thereafter a high-temperature short-time heat treatment (RTA: rapid thermal annealing) is performed thereby activating the impurity region and recovering from lattice defects resulting from the ion implantation. A surface part of the impurity region is denatured to a compound layer with a prescribed metal.

In this proposed prior art, pre-annealing is performed for prompting recovery from the crystal defects resulting from the ion implantation as a pre-step for the high-temperature heat treatment of RTA. However, the subsequent RTA is performed at a high temperature exceeding 1000° C., to cause new crystal defects resulting not from the ion implantation but from thermal lattice strain (stress strain). Thus, a vertical leakage current from the impurity region to the substrate is disadvantageously increased due to the crystal defects resulting from the RTA.

SUMMARY OF THE INVENTION

An object of the present invention is to provide a method of manufacturing a semiconductor device capable of effectively preventing increase of a leakage current resulting from a high-temperature heat treatment.

Another object of the present invention is to provide a method of manufacturing a semiconductor device capable of readily recovering from crystal defects resulting from a high-temperature heat treatment.

A method of manufacturing a semiconductor device according to an aspect of the present invention comprises steps of forming an impurity region on the main surface of a semiconductor substrate, performing a high-temperature heat treatment for activating the impurity region, and performing a low-temperature heat treatment after performing the high-temperature heat treatment. In the present invention, the term "semiconductor substrate" indicates a wide concept including not only a general semiconductor substrate but also a semiconductor thin film etc. In the method of manufacturing a semiconductor device according to this aspect, it is possible to recover from crystal defects resulting from the high-temperature heat treatment by the low-temperature heat treatment.

A method of manufacturing a semiconductor device according to another aspect of the present invention comprises steps of forming an impurity region by selectively ion-implanting an impurity into the main surface of a semiconductor substrate, activating the impurity region by performing a high-temperature heat treatment, and recovering from crystal defects resulting from the high-temperature heat treatment by performing a low-temperature heat treatment after performing the high-temperature heat treatment. In the method of manufacturing a semiconductor device according to this aspect, it is possible to recover from crystal defects resulting from the ion implantation by the high-temperature heat treatment simultaneously with activation of the impurity. Further, it is possible to recover from crystal defects resulting from the high-temperature heat treatment by the low-temperature heat treatment.

The method of manufacturing a semiconductor device according to this aspect may further comprise a step of denaturing a surface part of the impurity region to a compound layer with a metal film. When forming such a compound layer, wiring resistance of the impurity region can be reduced. In this case, the step of denaturing the surface part to the compound layer preferably includes a step of forming a metal film on the impurity region and thereafter performing a heat treatment thereby denaturing the surface part of the impurity region to the compound layer with the metal film, and the temperature for the heat treatment for denaturing the surface part to the compound layer is preferably not in excess of the temperature for the high-temperature heat treatment. Thus, the crystal defects from which the semiconductor device is recovered by the low-temperature heat treatment are not caused again.

In the aforementioned case, the heat treatment for denaturing the surface part to the compound layer preferably includes a first heat treatment for forming the compound layer and a second heat treatment for reducing the resistance of the formed compound layer, and the temperature for the first and second heat treatments is preferably not in excess of the temperature for the high-temperature heat treatment. Thus, the crystal defects from which the semiconductor device is recovered by the low-temperature heat treatment are not caused again.

In the method of manufacturing a semiconductor device according to this aspect, further, it is preferable to recover from crystal defects resulting from the ion implantation in addition to activation of the impurity by the high-temperature heat treatment and to recover from remaining crystal defects resulting from the ion implantation, left unrecoverable through the high-temperature heat treatment, in addition to recovery from the crystal defects resulting from the high-temperature heat treatment by the low-temperature heat treatment. In this case, the temperature for the high-temperature heat treatment is preferably at a level capable of recovering from the crystal defects resulting from the ion implantation and having a possibility of causing new crystal defects, and the temperature for the low-temperature heat treatment is preferably at a level capable of recovering from the crystal defects resulting from the high-temperature heat treatment and the remaining crystal defects resulting from the ion implantation, left unrecoverable through the high-temperature heat treatment, and having no possibility of causing new crystal defects. More specifically, the temperature for the high-temperature heat treatment is at least about 1000° C., and the temperature for the low-temperature heat treatment is at least about 750° C. and less than about 1000° C.

In the method of manufacturing a semiconductor device according to this aspect, the high-temperature heat treatment is preferably performed for a short time, and the low-temperature heat treatment is preferably performed for a long time. More specifically, the high-temperature heat treatment is performed for a time of at least about 0.1 sec. and not more than about 30 sec., and the low-temperature heat treatment is performed for a time of at least about 30 min. and not more than about 120 min.

A method of manufacturing a semiconductor device according to still another aspect of the present invention comprises steps of forming a low-concentration impurity region by selectively ion-implanting an impurity into the main surface of a semiconductor substrate, activating the low-concentration impurity region by performing a first high-temperature heat treatment, recovering from crystal defects resulting from the first high-temperature heat treatment by performing a first low-temperature heat treatment after performing the first high-temperature heat treatment, forming a high-concentration impurity region by selectively ion-implanting an impurity into the main surface of the semiconductor substrate, activating the high-concentration impurity region by performing a second high-temperature heat treatment, and recovering from crystal defects resulting from the second high-temperature heat treatment by performing a second low-temperature heat treatment after performing the second high-temperature heat treatment.

In the method of manufacturing a semiconductor device according to this aspect, it is possible to recover from crystal defects resulting from the ion implantation for forming the low-concentration impurity region by the first low-temperature heat treatment simultaneously with activation of the impurity in the low-concentration impurity region. It is possible to recover from crystal defects resulting from the first high-temperature heat treatment by the first low-temperature heat treatment. Further, it is possible to recover from crystal defects resulting from the ion implantation for forming the high-concentration impurity region, by the second high-temperature heat treatment simultaneously with activation of the impurity in the high-concentration impurity region. It is possible to recover from crystal defects resulting from the second high-temperature heat treatment by the second low-temperature heat treatment.

The method of manufacturing a semiconductor device according to this aspect may further comprise a step of denaturing a surface part of the high-concentration impurity region to a compound layer with a metal film. Wiring resistance of the high-concentration impurity region can be reduced by forming such a compound layer. In this case, the step of denaturing the surface part to the compound layer preferably includes a step of forming a metal film on the high-temperature impurity region and thereafter performing a heat treatment thereby denaturing the surface part of the high-temperature impurity region to the compound layer with the metal film, and the temperature for the heat treatment for denaturing the surface part to the compound layer is preferably not in excess of the temperature for the first and second high-temperature heat treatments. Thus, the crystal defects from which the semiconductor device is recovered by the first and second low-temperature heat treatments are not caused again.

In the aforementioned case, the heat treatment for denaturing the surface part to the compound layer preferably includes a first heat treatment for forming the compound layer and a second heat treatment for reducing the resistance of the formed compound layer, and the temperature for the first and second heat treatments is preferably not in excess of the temperature for the first and second high-temperature heat treatments. Thus, the crystal defects from which the semiconductor device is recovered by the first and second low-temperature heat treatments are not caused again.

In the method of manufacturing a semiconductor device according to this aspect, it is preferable to recover from crystal defects resulting from the ion implantation in addition to activation of the impurity by the first and second high-temperature heat treatments, and to recover from remaining crystal defects resulting from the ion implantation, left unrecoverable through the first and second high-temperature heat treatments, in addition to recovery from the crystal defects resulting from the first and second high-temperature heat treatments by the first and second low-temperature heat treatments. In this case, the temperature for the first and second high-temperature heat treatments is preferably at a level capable of recovering from the crystal defects resulting from the ion implantation and having a possibility of causing new crystal defects, and the temperature for the first and second low-temperature heat treatments is preferably at a level capable of recovering from the crystal defects resulting from the first and second high-temperature heat treatments and the remaining crystal defects resulting from the ion implantation, left unrecoverable through the first and second high-temperature heat treatments, and having no possibility of causing new crystal defects. More specifically, the temperature for the first and second high-temperature heat treatments is at least about 1000° C., and the temperature for the first and second low-temperature heat treatments is at least about 750° C. and less than about 1000° C.

In the method of manufacturing a semiconductor device according to this aspect, the first and second high-temperature heat treatments are preferably performed for a short time, and the first and second low-temperature heat treatments are preferably performed for a long time. More specifically, the first and second high-temperature heat treatments are performed for a time of at least about 0.1 sec. and not more than about 30 sec., and the first and second low-temperature heat treatments are performed for a time of at least about 30 min. and not more than about 120 min.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 9 are sectional views for illustrating a manufacturing process for a semiconductor device according to an embodiment of the present invention.

DESCRIPTION OF THE PREFERRED EMBODIMENTS

Figure 1:
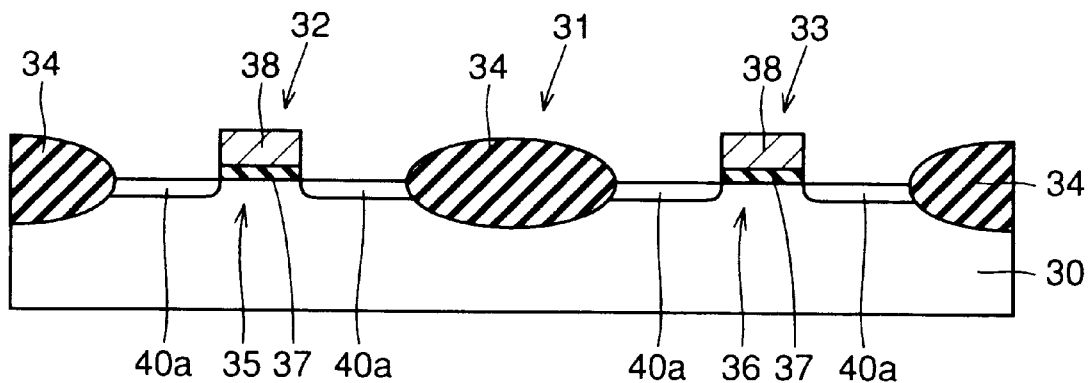
Figure 2:
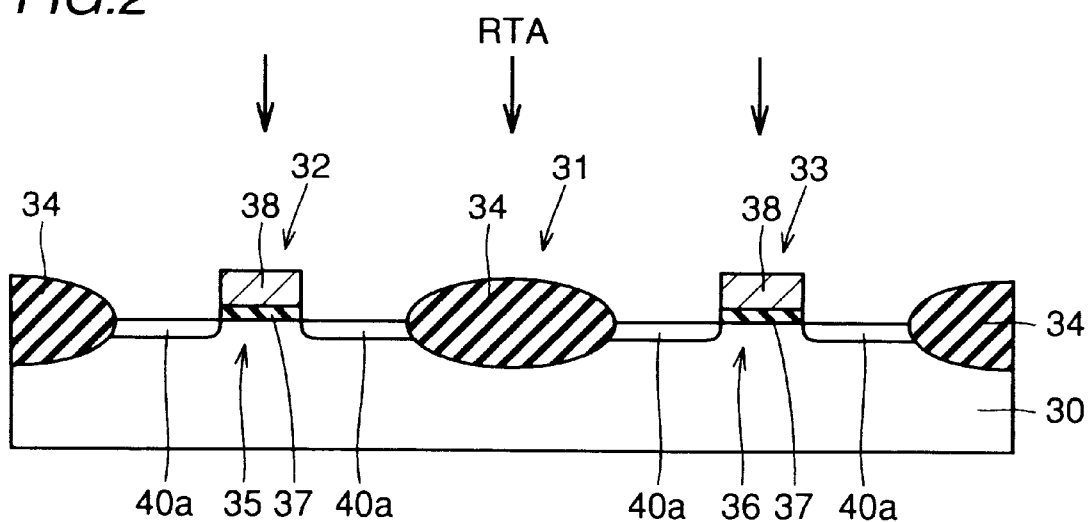
Figure 5:
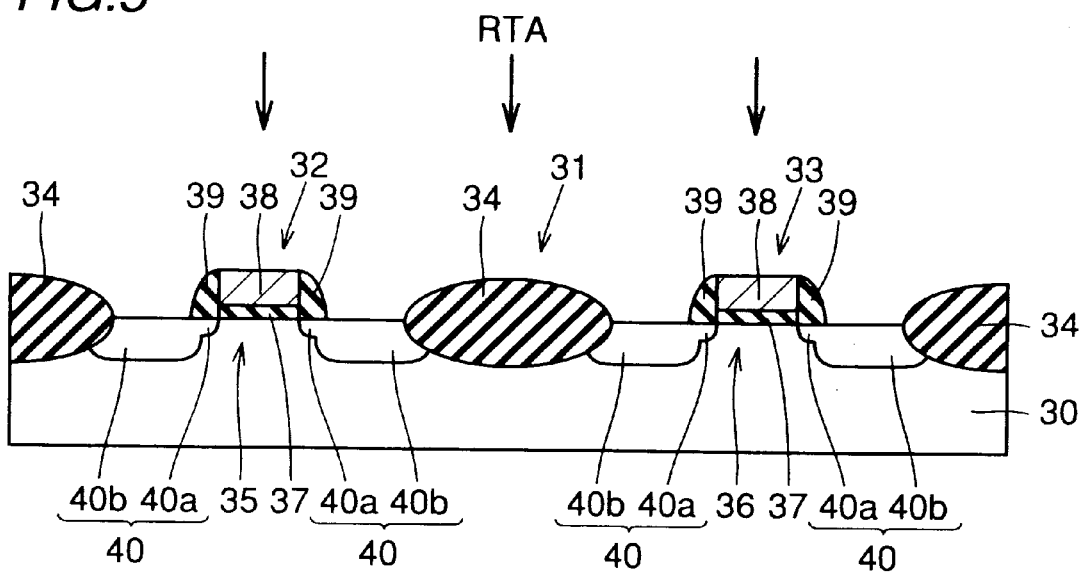
Figure 6:
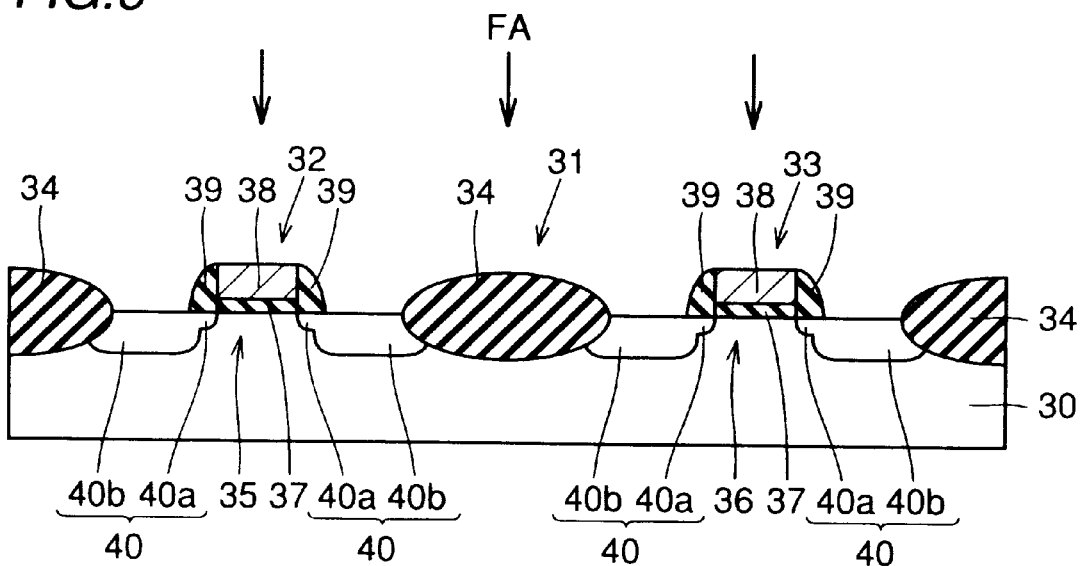
Figure 7:
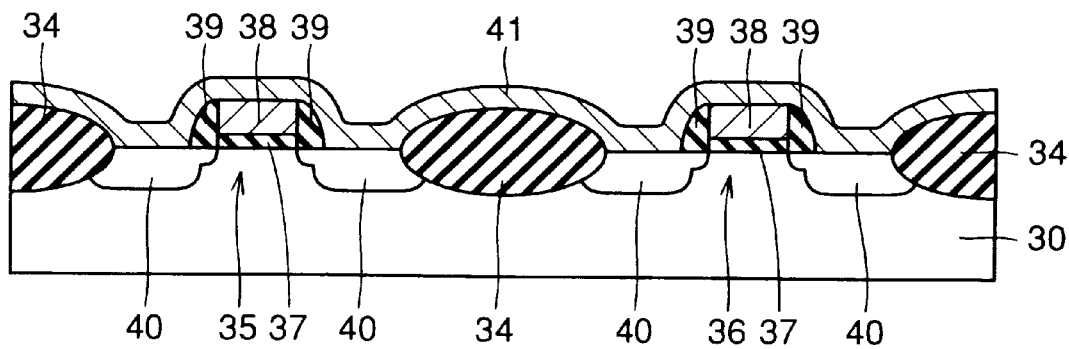
Figure 8:
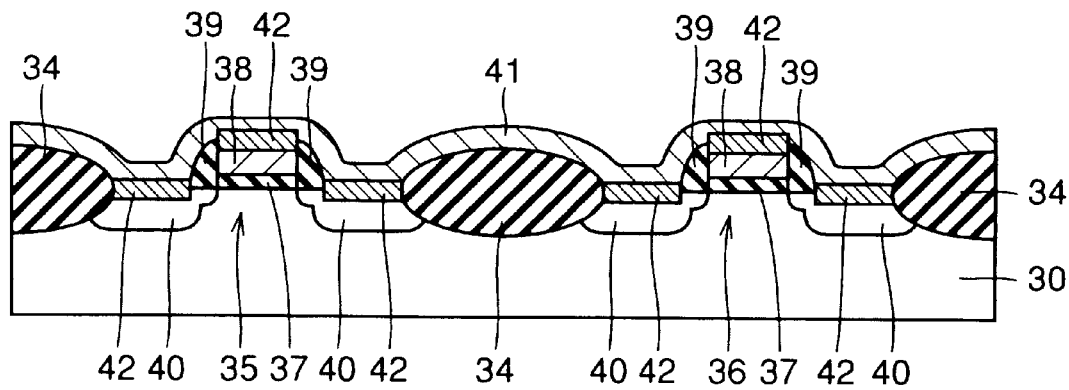
Figure 9:
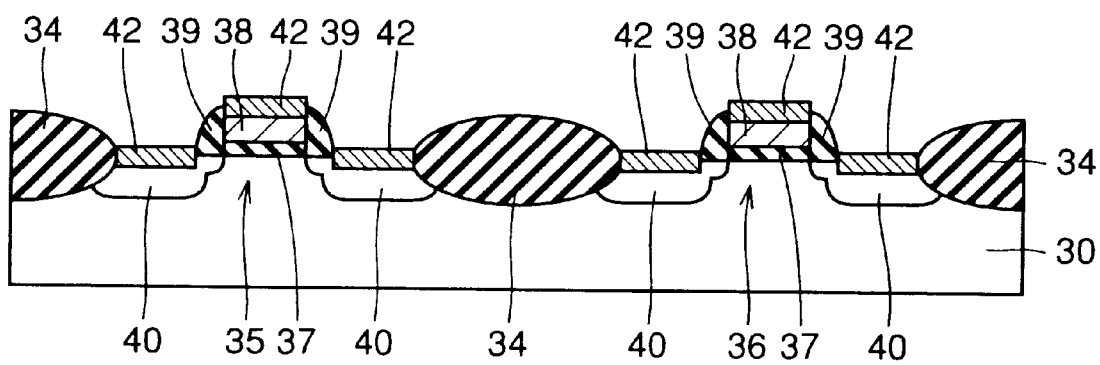

A manufacturing process for a semiconductor device according to an embodiment of the present invention is now described with reference to FIGS. 1 to 9. In this embodiment, the present invention is applied to a manufacturing process for p-channel MOS transistors having a salicide structure.

Step 1 (see FIG. 1): An element isolation region 31 isolates a first element forming region 32 and a second element forming region 33 from each other on the main surface of an n-type single-crystalline silicon substrate 30. An element isolation insulator film 34 is formed on the element isolation region 31 by a LOCOS (local oxidation of silicon) method. Thereafter gate electrodes 38 consisting of polycrystalline silicon films doped with an impurity are formed on the first element forming region 32 and the second element forming region 33 over gate insulator films 37. $BF_2$ is ion-implanted into the substrate 30 with the gate electrodes 38 serving as masks, thereby forming low-concentration impurity regions 40a. The conditions for this $BF_2$ ion implantation are an injection energy of about 10 keV and a dose of about $5 \times 10^{14}$ cm$^{-2}$.

Step 2 (see FIG. 2): A high-temperature short-time heat treatment is performed by RTA (rapid thermal annealing) thereby activating the impurity in the low-concentration impurity regions 40a and simultaneously recovering from crystal defects (lattice defects) caused in the low-concentration impurity regions 40a by the ion implantation.

The conditions for this RTA are a heat source of a halogen lamp, a temperature of about 1000° C. to 1200° C., an atmosphere of $N_2$ and a time of about 0.1 sec. to about 30 sec.

Step 3 (see FIG. 3): While the heat treatment by RTA can be completed in a short time, crystal defects may be caused in the low-concentration impurity regions 40a again due to the aforementioned high temperature of at least about 1000° C. Further, it may be impossible to recover from all crystal defects resulting from the ion implantation by the RTA.

In the step 3, a heat treatment (FA: furnace anneal) employing an electric furnace is performed thereby recovering from crystal defects resulting from the RTA and remaining crystal defects resulting from the ion implantation left unrecoverable through RTA. More specifically, atoms are recombined and relocated due to the heat treatment employing FA, whereby it is possible to recover from crystal defects resulting from lattice strain of Si.

The conditions for this FA are a heat source of an electric furnace, a temperature of about 750° C. to about 850° C., an atmosphere of $N_2$ and a time of about 30 min. to about 120 min.

The heat treatment by RTA in the aforementioned step 2 corresponds to the "high-temperature heat treatment" or the "first high-temperature heat treatment" in the present invention. The term "high temperature" indicates a temperature capable of recovering from crystal defects resulting from ion implantation and having a possibility of causing new crystal defects. In this embodiment, the "high temperature" means a temperature of at least about 1000° C. The heat treatment by FA in the aforementioned step 3 corresponds to the "low-temperature heat treatment" or the "first low-temperature heat treatment" in the present invention. The term "low temperature" indicates a temperature capable of recovering from crystal defects resulting from RTA (high-temperature heat treatment) and remaining crystal defects resulting from ion implantation, left unrecoverable through RTA, and having no possibility of causing new crystal defects. In this embodiment, the "low temperature" means a temperature of at least 750° C. and less than about 1000° C.

Step 4 (see FIG. 4): An insulator film is deposited to cover the overall surface and thereafter etched back, thereby forming side wall spacers 39 on the side surfaces of the gate electrodes 38. Boron (B) is ion-implanted into the substrate 30 with the gate electrodes 38 and the side wall spacers 39 serving as masks, thereby forming high-concentration impurity regions 40b. The conditions for this boron ion implantation are injection energy of about 10 keV and a dose of about $5 \times 10^{15}$ cm$^{-2}$. Thus, source/drain regions 40 of an LDD (lightly doped drain) structure consisting of the low-concentration impurity regions 40a and the high-concentration impurity regions 40b are formed.

A first field-effect transistor 35 and a second field-effect transistor 36 having the gate insulator films 37, the gate electrodes 38, the source/drain regions 40 and the side wall spacers 39 respectively are formed in the aforementioned manner.

Step 5 (see FIG. 5): A high-temperature short-time heat treatment employing RTA (rapid thermal annealing) is performed similarly to the step 2, thereby activating the impurity in the high-concentration impurity regions 40b while simultaneously recovering from crystal defects (lattice defects) caused in the high-concentration impurity regions 40b by the ion implantation.

The conditions for this RTA are a heat source of a halogen lamp, a temperature of about 1000° C. to 1200° C., an atmosphere of $N_2$ and a time of about 0.1 sec. to about 30 sec., similarly to the step 2.

Step 6 (see FIG. 6): A heat treatment (FA: furnace anneal) employing an electric furnace is performed similarly to the step 3, thereby recovering from crystal defects resulting from the RTA and remaining crystal defects resulting from the ion implantation left unrecoverable through the RTA.

The conditions for this FA are a heat source of an electric furnace, a temperature of about 750° C. to about 850° C., an atmosphere of $N_2$ and a time of about 30 min. to about 120 min., similarly to the step 3.

The heat treatment by RTA in the aforementioned step 5 corresponds to the "high-temperature heat treatment" or the "second high-temperature heat treatment" in the present invention. Further, the heat treatment by FA in the aforementioned step 6 corresponds to the "low-temperature heat treatment" or the "second low-temperature heat treatment" in the present invention.

Step 7 (see FIG. 7): A natural oxide film formed on the main surface of the substrate 30 is removed by isotropic etching, and thereafter a titanium (Ti) film 41 is formed on the overall surface of the substrate 30 by magnetron sputtering. The thickness of the titanium film 41 is about 30 nm, for example. This titanium film 41 corresponds to the "metal film" in the present invention.

Step 8 (see FIG. 8): A first heat treatment is performed by a heat treatment employing RTA. As a result of this heat treatment, titanium silicide (TiSix) films 42 of a C49 phase are formed in a self-aligned manner on the regions where the titanium film 41 is in contact with the substrate 30 and the regions where the titanium film 41 is in contact with the gate electrodes 38. Exemplary TiSix is $TiSi_2$. These titanium silicide films 42 correspond to the "compound layer" in the present invention.

The conditions for this RTA are a heat source of a halogen lamp, a temperature of about 600° C. to about 700° C., an atmosphere of $N_2$ and a time of about 30 sec. The temperature employed for this RTA is less than 1000° C., dissimilarly to the RTA in the step 2.

The aforementioned silicification does not occur on the region where the titanium film 41 is in contact with the element isolation film 34 and the regions where the titanium film 41 is in contact with the side wall spacers 39. Therefore, non-silicified portions of the titanium film 41 remain on the surfaces of these regions. Thin unreacted portions of the titanium film 41 remain also on the surfaces of the titanium silicide films 42.

Step 9 (see FIG. 9): The substrate 30 is dipped in a mixed solution of ammonia, aqueous hydrogen peroxide and water. Thus, the portions of the titanium film 41 not silicified in the step 8 are removed while leaving only the titanium silicide films 42.

Thereafter a second heat treatment is performed by RTA at a treatment temperature of about 700° C. to about 800° C. The remaining conditions for the second heat treatment are identical to those for the first heat treatment. The temperature for this RTA is also less than 1000° C., dissimilarly to the RTA in the step 2. The titanium silicide films 42 pass into a C54 phase of low resistance from the C49 phase of high resistance due to the second heat treatment.

The first and second field-effect transistors 35 and 36 manufactured in the aforementioned manner have a salicide structure. The sheet resistivity of the gate electrodes 38 having the titanium silicide films 42 on the surfaces and the source/drain regions 40 having the titanium silicide films 42 on the surfaces is reduced to about 3 $\Omega/\square$.

According to this embodiment, as hereinabove described, it is possible to recover from crystal defects resulting from the ion implantation by the RTA, and it is possible to recover from crystal defects resulting from the RTA and remaining crystal defects resulting from the ion implantation, left unrecoverable through the RTA, by the subsequent heat treatment through the electric furnace. Consequently, increase of a leakage current resulting from crystal defects can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

For example, the aforementioned embodiment may be modified as follows:

(1) The field-effect transistors shown in this embodiment have a salicide structure. However, the present invention is not restricted to a semiconductor device having such a salicide structure. The present invention is widely applicable to a method of forming impurity regions by ion implantation and recovering from crystal defects caused in the impurity regions.

(2) A titanium compound such as titanium nitride may be employed as the metal to be silicified, in place of titanium. Further, a metal having a high melting point other than titanium, such as molybdenum, tungsten, tantalum, hafnium, zirconium, niobium, vanadium, rhenium, chromium, platinum, iridium, osmium, rhodium, cobalt or nickel or a compound thereof may be employed.

(3) The non-silicified portions of the titanium film may be removed by wet etching. In this case, a mixed solution of aqueous hydrogen peroxide and aqueous ammonia, for example, is employed as the etching solution.

(4) The present invention may be applied to a method of manufacturing n-channel MOS transistors in place of p-channel MOS transistors.

(5) A conductive substrate or an insulating substrate of glass or the like may be employed in place of the single-crystalline silicon substrate (semiconductor substrate). While the field-effect transistors are formed on the single-crystalline silicon substrate in the aforementioned embodiment, the present invention is not restricted to this but is also sufficiently applicable to an LCD, for example, having a semiconductor layer formed on an insulating substrate and a device formed on the semiconductor layer. The term "semiconductor substrate" in the present invention indicates a wide concept including not only a general semiconductor substrate but also such a semiconductor layer.

What is claimed is:

1. A method of manufacturing a semiconductor device comprising steps of:

forming an impurity region on a surface of a semiconductor substrate;

performing a high-temperature heat treatment of the semiconductor substrate at a temperature in the range from 1000 to 1200° C., for activating said impurity region; then performing a low-temperature heat treatment at a temperature in the range from 750 to 1000° C.; and then depositing a film onto said semiconductor surface.

2. The method of manufacturing a semiconductor device according to claim 1, further comprising a step of denaturing a surface part of said impurity region to a compound layer with a metal film.

3. The method of manufacturing a semiconductor device according to claim 2, wherein said step of denaturing said surface part to said compound layer includes a step of forming a metal film on said impurity region and thereafter performing a heat treatment thereby denaturing said surface part of said impurity region to said compound layer with said metal film, and the temperature for said heat treatment for denaturing said surface part to said compound layer is not in excess of the temperature for said high-temperature heat treatment.

4. The method of manufacturing a semiconductor device according to claim 3, wherein said heat treatment for denaturing said surface part to said compound layer includes:

a first heat treatment for forming said compound layer, and a second heat treatment for reducing the resistance of said formed compound layer, and the temperature for said first and second heat treatments is not in excess of the temperature for said high-temperature heat treatment.

5. The method of manufacturing a semiconductor device according to claim 1, wherein said high-temperature heat treatment is performed for a time of at least about 0.1 sec. and not more than about 30 sec., and said low-temperature heat treatment is performed for a time of at least about 30 min. and not more than about 120 min.

6. A method of manufacturing a semiconductor device comprising steps of:

forming a low-concentration impurity region by selectively ion-implanting an impurity into a main surface of a semiconductor substrate;

performing a first high-temperature heat treatment;

performing a first low-temperature heat treatment after performing said high-temperature heat treatment; and then forming a high-concentration impurity region by selectively ion-implanting an impurity into the main surface of said semiconductor substrate;

performing a second high-temperature heat treatment; and performing a second low-temperature heat treatment after performing said high-temperature heat treatment.

7. The method of manufacturing a semiconductor device according to claim 6, further comprising a step of denaturing a surface part of said high-concentration impurity region to a compound layer with a metal film.

8. The method of manufacturing a semiconductor device according to claim 7, wherein said step of denaturing said surface part to said compound layer includes a step of forming a metal film on said high-temperature impurity region and thereafter performing a heat treatment thereby denaturing said surface part of said high-temperature impurity region to said compound layer with said metal film, and the temperature for said heat treatment for denaturing said surface part to said compound layer is not in excess of the temperature for said first and second high-temperature heat treatments.

9. The method of manufacturing a semiconductor device according to claim 8, wherein said heat treatment for denaturing said surface part to said compound layer includes:

a first heat treatment for forming said compound layer, and a second heat treatment for reducing the resistance of said formed compound layer, and the temperature for said first and second heat treatments is not in excess of the temperature for said first and second high-temperature heat treatments.

10. The method of manufacturing a semiconductor device according to claim 6, wherein the temperature for said first and second high-temperature heat treatments is at least about 1000° C., and the temperature for said first and second low-temperature heat treatments is at least about 750° C.

11. The method of manufacturing a semiconductor device according to claim 6, wherein the first and second high-temperature heat treatments are performed for a time of at least about 0.1 sec. and not more than about 30 sec., and the first and second low-temperature heat treatments are performed for a time of at least about 30 min. and not more than about 120 min.

12. A method of manufacturing a semiconductor device comprising steps of:

forming an impurity region on a surface of a semiconductor substrate;

performing a high-temperature heat treatment of the semiconductor substrate at a temperature in the range from 1000 to 1200° C., for activating said impurity region; and then immediately performing a low-temperature heat treatment at a temperature in the range from 750 to 1000 ° C.

* * * * *